(12) United States Patent
Park et al.

(10) Patent No.: US 9,668,349 B2
(45) Date of Patent: May 30, 2017

(54) BACKLIGHT UNIT AND DISPLAY APPARATUS HAVING THE SAME

(71) Applicant: Samsung Display Co., Ltd., Yongin-si, Gyeonggi-do (KR)

(72) Inventors: Young-Min Park, Hwaseong-si (KR); Jaesang Lee, Asan-si (KR); Juhee Song, Anyang-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 212 days.

(21) Appl. No.: 14/699,552

(22) Filed: Apr. 29, 2015

(65) Prior Publication Data

US 2016/0044776 A1 Feb. 11, 2016

(30) Foreign Application Priority Data

Aug. 11, 2014 (KR) ........................ 10-2014-0103799

(51) Int. Cl.
*H05K 1/18* (2006.01)
*G02F 1/1335* (2006.01)

(52) U.S. Cl.
CPC ....... *H05K 1/181* (2013.01); *G02F 1/133603* (2013.01); *H05K 2201/10106* (2013.01);
(Continued)

(58) Field of Classification Search
CPC ......... H05K 1/181; H05K 2201/10106; H05K 2201/10121; H05K 2201/10128; G02F 1/133603; G02F 1/133602; G02F 2001/133613; Y02P 70/611; F21V 5/007; F21Y 2115/10; G02B 6/0073; G02B 6/0086; G02B 6/0091
See application file for complete search history.

(56) References Cited

U.S. PATENT DOCUMENTS 9,454,037 B2 * 9/2016 Lee .................. G02F 1/133504
2016/0061414 A1 * 3/2016 Song ................ G02F 1/133603
362/97.1

(Continued)

FOREIGN PATENT DOCUMENTS

KR 1020080029386 A 4/2008
KR 1020090102536 A 9/2009

(Continued)

*Primary Examiner* — Bao Q Truong
(74) *Attorney, Agent, or Firm* — Robert E. Bushnell, Esq.

(57) ABSTRACT

A display apparatus includes a display panel curved along a first direction and a backlight unit providing a light to the display panel. The backlight unit includes a bottom chassis curved along the first direction and including a bottom portion configured to include first and second areas arranged in the first direction, light emitting diodes disposed on the bottom portion, and lens units covering the light emitting diodes in a one-to-one correspondence. The light emitting diodes includes a first light emitting diode in the first area and a second light emitting diode in the second area. A first lens distance between the first light emitting diode and a first lens unit covering the first light emitting diode is different from a second lens distance between the second light emitting diode and a second lens unit covering the second light emitting diode.

20 Claims, 13 Drawing Sheets

(52) U.S. Cl.
CPC ............. *H05K 2201/10121* (2013.01); *H05K 2201/10128* (2013.01); *Y02P 70/611* (2015.11)

(56) References Cited

U.S. PATENT DOCUMENTS

2016/0238894 A1\*  8/2016  Choi .................. G02F 1/133603
2016/0357066 A1\*  12/2016  Liu ................... G02F 1/133603

FOREIGN PATENT DOCUMENTS

| KR | 1020130062222 A | 6/2013 |
| KR | 1020130074549 A | 7/2013 |
| KR | 101299528 B1 | 8/2013 |
| KR | 1020140007202 A | 1/2014 |

\* cited by examiner

BACKLIGHT UNIT AND DISPLAY APPARATUS HAVING THE SAME

CLAIM OF PRIORITY

This U.S. non-provisional patent application claims the priority of and all the benefits accruing under 35 U.S.C. §119 of Korean Patent Application No. 10-2014-0103799, filed on Aug. 11, 2014 in the Korean Intellectual Property Office ("KIPO"), the contents of which are hereby incorporated by reference.

BACKGROUND OF THE INVENTION

Field of the Invention

The present disclosure relates to a backlight unit and a display apparatus having the same. More particularly, the present disclosure relates to a backlight unit capable of improving brightness uniformity and a display apparatus having the backlight unit.

Description of the Related Art

Non-self-emissive display devices, such as a liquid crystal display device, an electrophoretic display device, an electrowetting display device, etc., require a backlight unit to emit light. The backlight unit is classified into an edge-illumination type backlight unit and a direct-illumination type backlight unit according to a position of a light emitting diode with respect to a display surface on which an image is displayed. The direct-illumination type backlight unit does not need a light guide plate and a heat discharging element, which are required for the edge-illumination type backlight unit, and thus a manufacturing cost of the direct-illumination type backlight unit is relatively lower than that of the edge-illumination type backlight unit. In addition, since a light loss in the direct-illumination type backlight unit is smaller than that of the edge-illumination type backlight unit, the direct-illumination type backlight unit provides brightness higher than that of the edge-illumination type backlight unit at the same voltage.

The display device has been designed to have a flat shape, but recently a display device having a curved surface shape has been developed. The curved surface shape display device provides a user with the image having improved three-dimensional effect, sense of immersion (immersiveness), and sense of presence (presence).

Using direct-illumination type backlight unit in the display device having curved surface shape may generate problems of dark or bright spot occurred in display panel of the display device.

SUMMARY OF THE INVENTION

The present disclosure provides a backlight unit capable of improving brightness uniformity.

The present disclosure provides a display apparatus having an improved display quality.

Embodiments of the inventive concept provide a display apparatus including a display panel and a backlight unit.

The display panel is curved along a first direction. The backlight unit provides a light to the display panel. The backlight unit includes a bottom chassis, a plurality of light emitting diodes, and a plurality of lens units. The bottom chassis is curved along the first direction and includes a bottom portion configured to include a first area and a second area, which are arranged in the first direction. The light emitting diodes are disposed on the bottom portion. The lens units cover the light emitting diodes in a one-to-one correspondence.

The light emitting diodes include a first light emitting diode and a second light emitting diode. The first light emitting diode is disposed in the first area and the second light emitting diode is disposed in the second area. A first lens distance between the first light emitting diode and a first lens unit covering the first light emitting diode among the lens units is different from a second lens distance between the second light emitting diode and a second lens unit covering the second light emitting diode among the lens units.

Embodiments of the inventive concept provide a backlight unit including a bottom chassis, a plurality of light emitting diodes, and a plurality of lens units. The bottom chassis is curved along a first direction and includes a bottom portion in which a first area and a second area are defined. The light emitting diodes are disposed on the bottom portion. The lens units cover the light emitting diodes in a one-to-one correspondence.

The light emitting diodes include a first light emitting diode and a second light emitting diode. The first light emitting diode is disposed in the first area and the second light emitting diode is disposed in the second area. A first lens distance between the first light emitting diode and a first lens unit covering the first light emitting diode among the lens units is different from a second lens distance between the second light emitting diode and a second lens unit covering the second light emitting diode among the lens units.

According to the above, the bottom portion of the backlight unit curved in the first direction has a radius of curvature different from that of the diffusion member. Therefore, the optical distance between the diffusion member and the light emitting diodes becomes different, depending on positions of the light emitting diodes. In addition, a pitch between the light emitting diodes spaced apart from each other in the first direction is proportional to the optical distance. Thus, the number of the light emitting diodes may be reduced more than when the optical distance is uniform. As a result, a manufacturing cost of the backlight unit and the display apparatus may be reduced.

In addition, the first lens distance between the first light emitting diode disposed in the first area of the bottom chassis and the first lens unit covering the first light emitting diode is different from the second lens distance between the second light emitting diode disposed in the second area of the bottom chassis and the second lens unit covering the second light emitting diode. Accordingly, the degree of diffusion of the light passing through the first lens unit is different from the degree of the diffusion of the light passing through the second lens unit due to the difference between the first and second lens distances. Therefore, defects, e.g., a bright spot or a dark spot, which occur in the display panel, may be reduced by using the difference in degree of diffusion of the light, which is caused by the difference between the lens distances.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
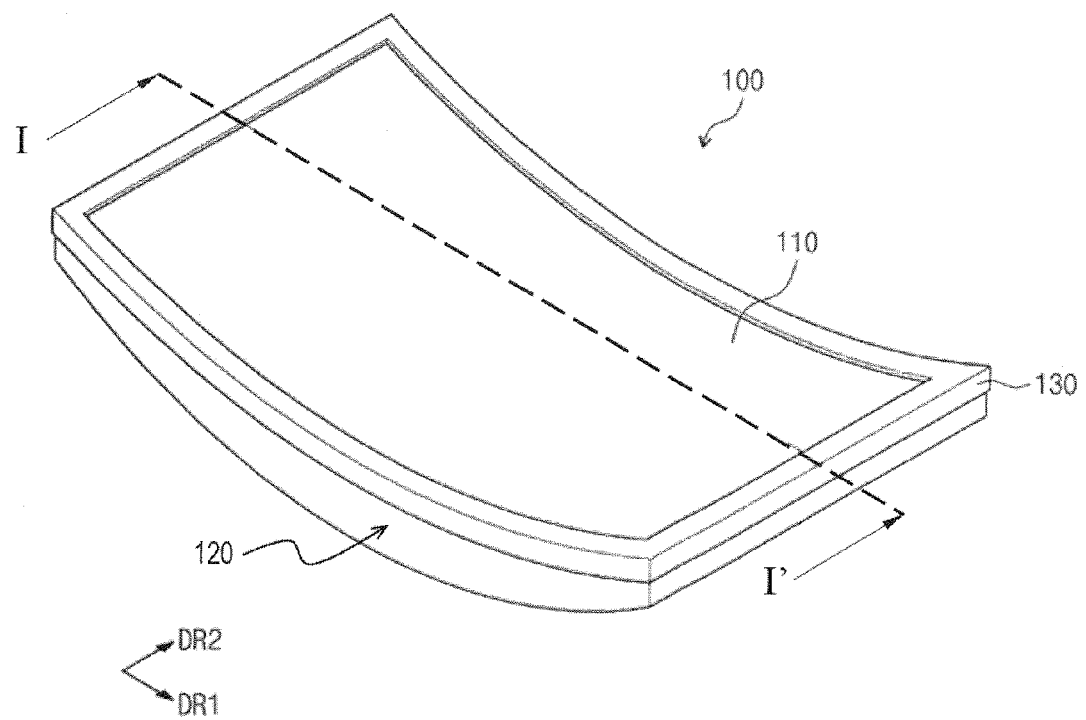
FIG. 1 is a perspective view showing a display apparatus according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in detail with reference to the accompanying drawings.

Figure 2:
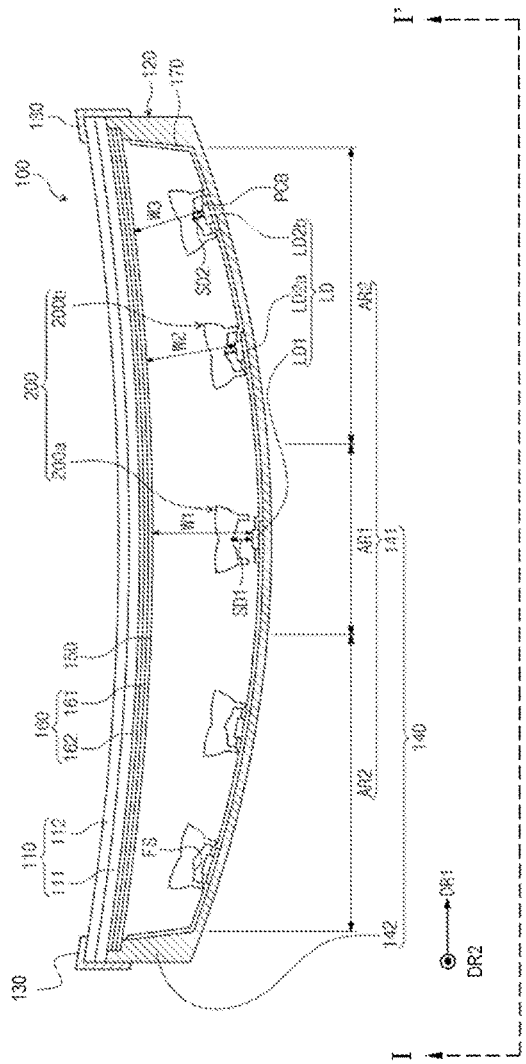
FIG. 2 is a cross-sectional view taken along a line I-I' of FIG. 1.
Figure 3:
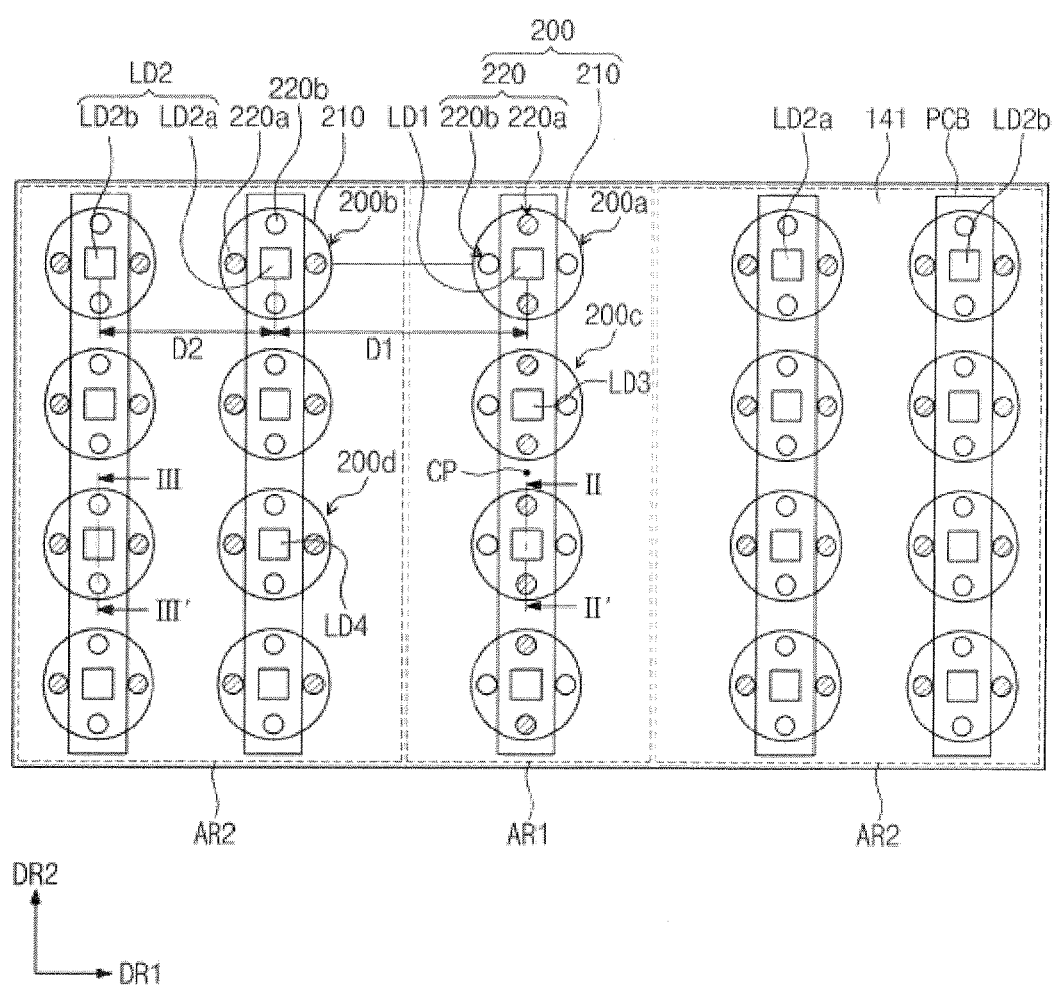
FIG. 3 is a plan view showing light emitting diodes disposed on a bottom portion of a bottom chassis shown in FIG. 1.

FIG. 1 is a perspective view showing a display apparatus according to an exemplary embodiment of the present disclosure, FIG. 2 is a cross-sectional view taken along a line I-I' of FIG. 1, and FIG. 3 is a plan view showing light emitting diodes disposed on a bottom portion of a bottom chassis shown in FIG. 1.

Referring to FIGS. 1, 2, and 3, a display apparatus 100 includes a display panel 110, a backlight unit 120, and a top chassis 130. For the convenience of explanation, a direction in which an image is displayed on the display apparatus 100 is referred to as an upper direction and a direction opposite to the upper direction is referred to as a lower direction.

The display panel 110 displays the image. The display panel 110 may be a liquid crystal display panel, an electrowetting display panel, an electrophoretic display panel, or a microelectromechanical system (MEMS) display panel. In the present exemplary embodiment, the liquid crystal display panel will be described as the display panel 110.

The display panel 110 may have a quadrangular plate shape with two pairs of sides. In the present exemplary embodiment, the display panel 110 has a rectangular shape with a pair of long sides and a pair of short sides. The display panel 110 includes a display substrate 111, an opposite substrate 112 facing the display substrate 111, and a liquid crystal layer (not shown) interposed between the display substrate 111 and the opposite substrate 112. When viewed in a plan view, the display panel 110 includes a display area displaying the image and a non-display area surrounding the display area, and no image is displayed in the non-display area.

The display panel 110 may be curved along a longitudinal direction thereof, and in the present exemplary embodiment, the display panel 110 is curved along a first direction DR1. Thus, the display panel 110 may display the image having improved immersiveness and presence through the display area, which has a concave curved surface shape.

The backlight unit 120 provides a light to the display panel 110 and is disposed under the display panel 110. The backlight unit 120 includes a bottom chassis 140, a plurality of light emitting diodes LD emitting the light, and a plurality of lens units 200 covering the light emitting diodes LD in a one-to-one correspondence, and a diffusion member 150 disposed above the lens units 200.

The bottom chassis 140 includes a bottom portion 141 and sidewalls 142 extending from the bottom portion 141. The sidewalls 142 extend in the upper direction from the bottom portion 141 and are inclined with respect to an extending surface of the bottom portion 141 with a predetermined angle. The bottom portion 141 has a curved shape along the first direction DR1 and includes a first area AR1 and a second area AR2, which are arranged along the first direction DR1. When viewed in a plan view, the first area AR1 overlaps a center portion CP of the bottom portion 141 and extends in a second direction DR2 that is substantially perpendicular to the first direction DR1, and a remaining area of the bottom portion 141 except for the first area AR1 is defined as the second area AR2.

Optical sheets 160 are disposed between the diffusion member 150 and the display panel 110. The optical sheets 160 may control a path of the light emitted from the light emitting diodes LD. The optical sheets 160 are configured to include a prism sheet 161 and a protection sheet 162. When the diffusion member 150 diffuses the light, the prism sheet 161 condenses the light to allow a direction in which the diffused light travels to become closer to a normal line direction of the display panel 110. The protection sheet 162 protects the prism sheet 161 from external impacts. In the present exemplary embodiment, the optical sheets 160 include one prism sheet 161 and one protection sheet 162, but they should not be limited thereto or thereby. That is, at least one of the prism sheet 161 and the protection sheet 162 of the optical sheets 160 may be provided in a plural number, and one or more sheets of the optical sheets may be omitted if necessary.

The top chassis 130 is disposed on the display panel 110 to cover the non-display area of the display panel 110. The top chassis 130 is coupled to the bottom chassis 140 to support an edge of the display panel 110, and a display window is defined through the top chassis 130 to expose the display area of the display panel 110.

The light emitting diodes LD are arranged substantially in parallel to each other along the first direction DR1 and the second direction DR2 on the bottom portion 141. The light emitting diodes LD emit the light. A printed circuit board PCB is disposed between the light emitting diodes LD and the bottom portion 141, and the light emitting diodes LD are mounted on the printed circuit board PCB to receive a driving voltage through the printed circuit board PCB.

The backlight unit 120 may further include a reflection sheet 170. The reflection sheet 170 may be disposed on an inner surface of the sidewalls 142, between the lens units 200 and the printed circuit board PCB, and on an upper surface of the bottom portion 141. The reflection sheet 170 reflects the light incident thereto to the diffusion member 150.

The diffusion member 150 and the bottom portion 141 are curved along the first direction DR1 with different radius of curvatures from each other. In the present exemplary embodiment, the diffusion member 150 has a radius of curvature greater than that of the bottom portion 141. Thus, when defining a distance between one of the light emitting diodes LD and the diffusion member 150 is an optical distance, the optical distance may vary, depending on positions of the light emitting diodes LD.

For instance, the light emitting diodes LD include at least one first light emitting diode LD1 disposed in the first area AR1 and second light emitting diodes LD2a and LD2b disposed in the second area AR2, and the second light emitting diodes LD2a and LD2b are arranged in a direction away from the first area AR1.

Hereinafter, an optical distance between the first light emitting diode LD1 and the diffusion member 150 is referred to as a first optical distance W1, an optical distance between the second light emitting diode LD2a and the diffusion member 150 is referred to as a second optical distance W2, and an optical distance between the second light emitting diode LD2b and the diffusion member 150 is referred to as a third optical distance W3. In the present exemplary embodiment, the first optical distance W1 is greater than the second optical distance W2 and the second optical distance W2 is greater than the third optical distance W3. That is, the optical distance becomes smaller as a distance from the center portion CP of the bottom portion 141 becomes greater. However, among the light emitting diodes LD, the optical distances of the light emitting diodes LD arranged in the same column along the second direction DR2 are substantially the same as each other.

A pitch between the light emitting diodes LD arranged in the first direction DR1 is proportional to the optical distance between the light emitting diodes LD and the diffusion member 150. Thus, a first pitch D1 between the first light emitting diode LD1 and the second light emitting diode LD2a is greater than a second pitch D2 between the second light emitting diode LD2a and the second light emitting diode LD2b. That is, the pitch of the light emitting diodes LD arranged in the first direction DR1 increases as a distance from the center portion CP of the bottom portion 141 becomes smaller. When the pitch of the light emitting diodes LD arranged in the first direction DR1 increases, the number of the light emitting diodes LD arranged in the first direction DR1 may decrease. Thus, the manufacturing cost of the backlight unit 120 and the display apparatus 100 may be reduced.

The lens units 200 cover the light emitting diodes LD in a one-to-one correspondence. Each of the lens units 200 includes a lens 210 and supporting parts 220. Each lens 210 covers a corresponding light emitting diode of the light emitting diodes LD and each supporting part 220 is coupled to a bottom surface FS of a corresponding lens of the lenses 210.

In the present exemplary embodiment, the supporting parts 220 include at least one first supporting part 220a and at least one second supporting part 220b. The first supporting part 220a has a first length LL1 (shown in FIG. 4A) and the second supporting part 220b has a second length LL2 (shown in FIG. 4B). The second length LL2 (shown in FIG. 4B) may be smaller than the first length LL1 (shown in FIG. 4A). For instance, the first length LL1 (shown in FIG. 4A) may be about 1.5 times to about 3 times greater than the second length LL2 (shown in FIG. 4B).

In the present exemplary embodiment, a first lens unit 200a is disposed on the first light emitting diode LD1, and a second lens unit 200b is disposed on the second light emitting diode LD2. The first lens unit 200a is supported by the first supporting part 220a on the printed circuit board PCB, and the second lens unit 200b is supported by the second supporting part 220b on the printed circuit board PCB.

Hereinafter, a distance between one light emitting diode and one lens unit, which are coupled to each other among the light emitting diodes LD and the lens units 200, is referred to as a lens distance. In the present exemplary embodiment, the first light emitting diode LD1 and the first lens unit 200a are spaced apart from each other by a first lens distance SD1, and the second light emitting diode LD2 and the second lens unit 200b are spaced apart from each other by a second lens distance SD2.

The second lens distance SD2 is smaller than the first lens distance SD1. The first lens unit 200a has substantially the same shape as that of the second lens unit 200b, however, the second lens distance SD2 is smaller than the first lens distance SD1 since a coupling structure between the first lens unit 200a and the printed circuit board PCB is different from a coupling structure between the second lens unit 200b and the printed circuit board PCB.

Different from the present exemplary embodiment, in a case that light emitting diodes LD have substantially the same lens distance regardless of the positions thereof, the backlight unit 120 may not provide the light having uniform brightness over the entire area of the display area of the display panel 110 since the optical distances between the light emitting diodes LD and the diffusion member 150 are different from each other due to the positions of the light emitting diodes LD and the degree of diffusion of the light may vary, depending on the difference in the optical distance. However, according to the present exemplary embodiment, since the light emitting diodes LD have the first lens distance SD1 or the second lens distance SD2 according to the positions thereof, the degree of diffusion of the light emitted from the light emitting diodes LD may be changed according to the lens distance after passing through the lens units 200. Therefore, the differences in the degree of diffusion, which are caused by the difference in the optical distances, may be compensated. Consequently, the backlight unit 120 may provide the light having the uniform brightness to the display panel 110. This will be described in detail with reference to FIGS. 4A to 4C.

The light emitting diodes LD may further include a third light emitting diode LD3 and a fourth light emitting diode LD4. The third light emitting diode LD3 is disposed in the first area AR1 and spaced apart from the first light emitting diode LD1 in the second direction DR2. The fourth light emitting diode LD4 is disposed in the second area AR2 and spaced apart from the second light emitting diode LD2a in the second direction DR2.

The lens units 200 may further include a third lens unit 200c covering the third light emitting diode LD3 and a fourth lens unit 200d covering the fourth light emitting diode LD4. A lens distance between the third light emitting diode LD3 and the third lens unit 200c is substantially the same as the first lens distance SD1, and a lens distance between the fourth light emitting diode LD4 and the fourth lens unit 200d is substantially the same as the second lens distance SD2. That is, since the optical distances of the light emitting diodes LD arranged in the same column along the second direction DR2 are substantially the same as each other, the lens distances of the light emitting diodes LD arranged in the same column along the second direction DR2 are the same as each other.

In the present exemplary embodiment, each of the supporting parts 220 has a cylindrical shape, however, it should not be limited thereto or thereby. That is, each of the supporting parts 220 may have a polygonal pillar shape, e.g., a trigonal pillar shape, a square pillar shape, a pentagonal pillar shape, etc.

Figure 4A:
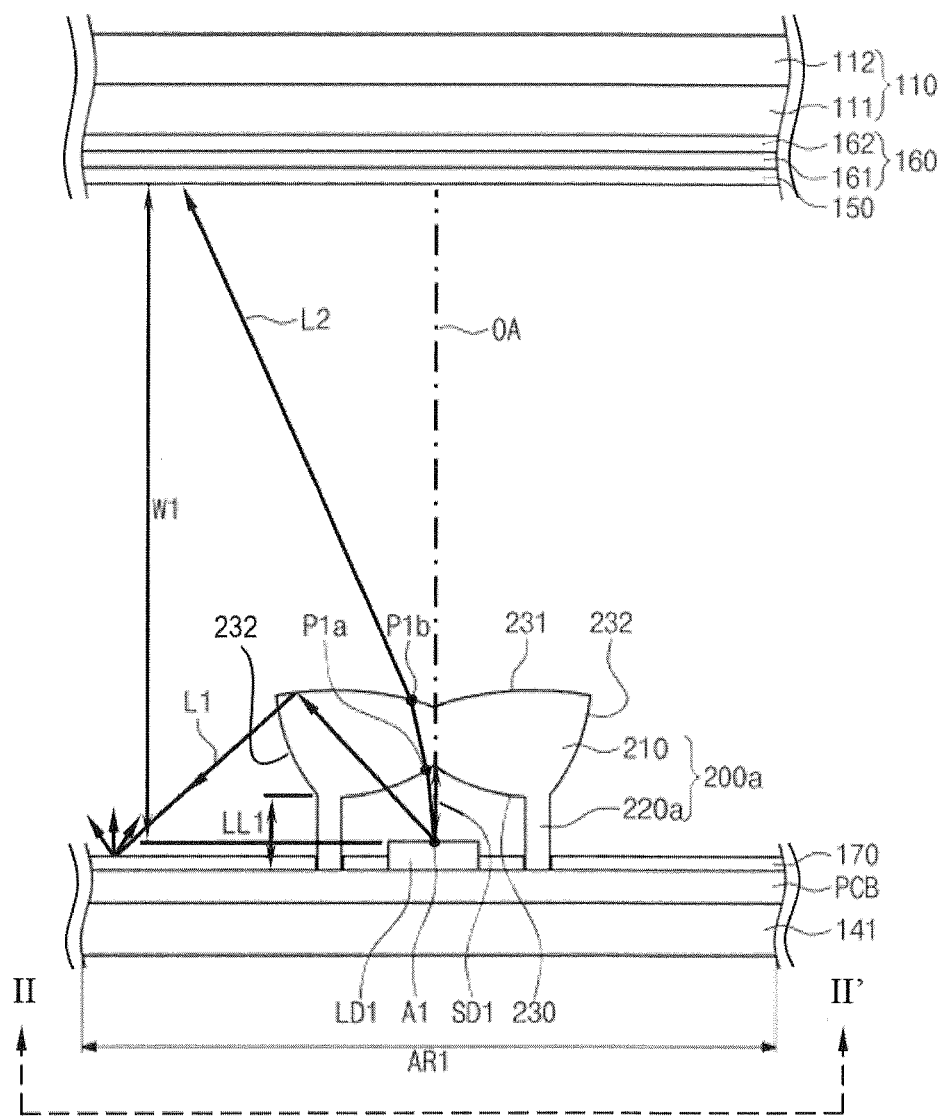
FIG. 4A is a cross-sectional view taken along a line II-II' of FIG. 3.
Figure 4B:
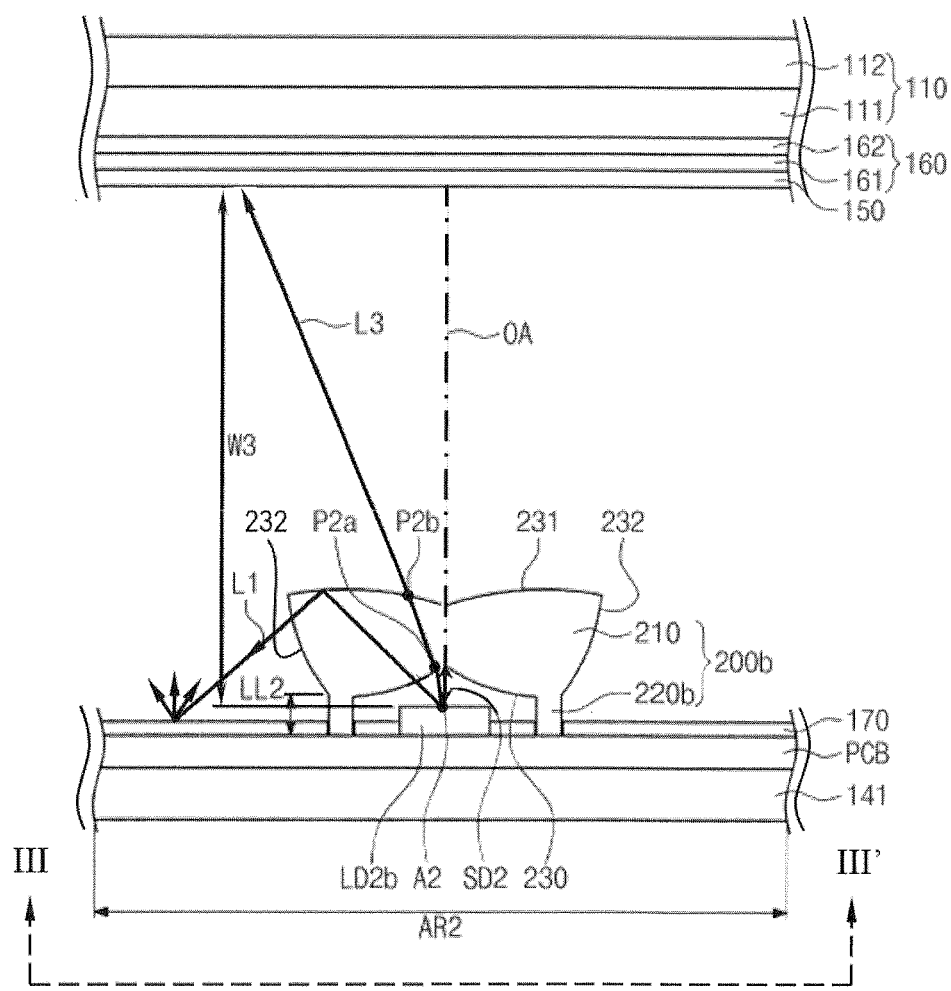
FIG. 4B is a cross-sectional view taken along a line III-III' of FIG. 3.
Figure 4C:
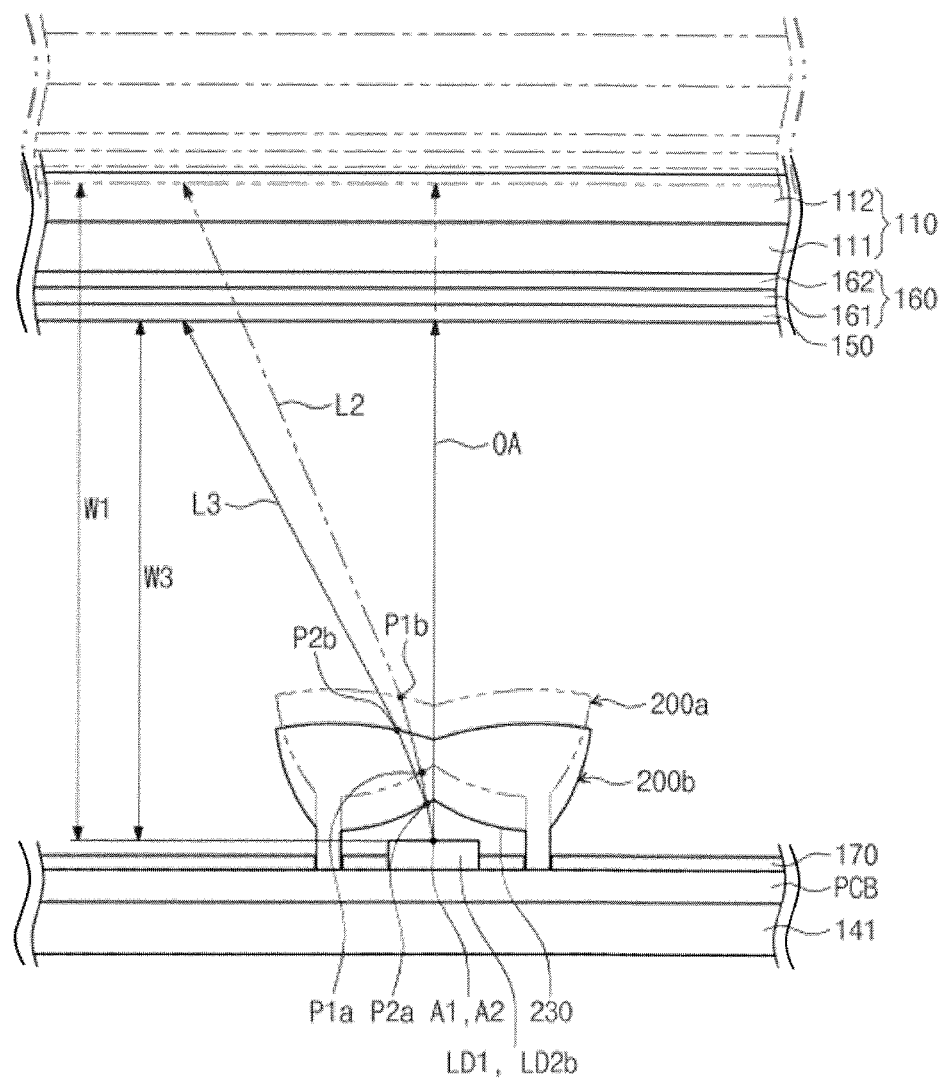
FIG. 4C is a cross-sectional view showing an effect of light diffusion in accordance with a distance between a light emitting diode and a lens.

FIG. 4A is a cross-sectional view taken along a line II-II' of FIG. 3, FIG. 4B is a cross-sectional view taken along a line III-III' of FIG. 3, and FIG. 4C is a cross-sectional view showing a light diffusion in accordance with a distance between the light emitting diodes and the lens.

Referring to FIGS. 4A to 4C, the lens 210 includes an incident surface 230, a first exit surface 231, and a second exit surface 232. When the light emitted from the light emitting diodes LD (refer to FIG. 3) is incident to the incident surface 230, the light exits through the first exit surface 231 or the second exit surface 232 after being refracted or reflected. In the present exemplary embodiment, the incident surface 230 and the first exit surface 231 have a concave shape, but they should not limited thereto or thereby. That is, the incident surface 230 and the first exit surface 231 of the lens 210 may have a convex shape.

According to a path of a first light L1 shown in FIG. 4A, the first light L1 emitted from the first light emitting diode LD1 is incident to the lens 210 through the incident surface 230, reflected by the first exit surface 231, and then exits to the outside of the lens 210 through the second exit surface 232. Also, the first light L1 exiting through the second exit surface 232 is reflected by the reflection sheet 170 to travel to the diffusion member 150.

Most of the light emitted from the light emitting diodes LD (refer to FIG. 2) may travel along a path similar to the path of the first light L1 and exit through the second exit surface 232 of the lens 210. However, a portion of the light emitted from the light emitting diodes LD (refer to FIG. 2) exits through the first exit surface 231 to travel to the diffusion member 150, depending on its incident angle without being reflected by the first exit surface 231.

In FIG. 4A, an axis substantially perpendicular to a first point A1 corresponding to a center portion of a light emitting surface of the first light emitting diode LD1 is referred to as an optical axis OA. A second light L2 emitted from the first light emitting diode LD1 at a predetermined angle with respect to the optical axis OA is refracted along the path shown in FIG. 4A and travels to the diffusion member 150. More particularly, the second light L2 is refracted while passing through a first incident point P1a of the incident surface 230 and refracted again while passing through a first exit point P1b of the first exit surface 231 to exit through the first exit surface 231.

In FIG. 4B, an axis substantially perpendicular to a second point A2 corresponding to a center portion of a light emitting surface of the second light emitting diode LD2b is referred to as an optical axis OA. A third light L3 emitted from the second light emitting diode LD2b at a predetermined angle with respect to the optical axis OA is refracted along a path shown in FIG. 4B and travels to the diffusion member 150. In more detail, the third light L3 is refracted while passing through a second incident point P2a of the incident surface 230 and refracted again while passing through a second exit point P2b of the first exit surface 231 to exit through the first exit surface 231. A third optical distance W3 between the second light emitting diode LD2b and the diffusion member 150 may be smaller than the first optical distance W1 between the first light emitting diode LD1 and the diffusion member 150.

Different from the present exemplary embodiment, when the lens distances of the light emitting diodes LD (refer to FIG. 2) are substantially the same as each other, the brightness of the light provided from the backlight unit 120 (refer to FIG. 2) to the display panel 110 is not uniform. Accordingly, a bright spot may occur in an area in the display panel 110, which corresponds to the upper portion of the second light emitting diode LD2b, and a dark spot may occur in an area in the display panel 110, which corresponds to the upper portion of the first light emitting diode LD1. However, in the present exemplary embodiment, since the first lens distance SD1 of the first light emitting diode LD1 is different from the second lens distance SD2 of the second light emitting diode LD2b, the degree of diffusion of the second light L2 exiting at the predetermined angle formed with the optical axis OA is different from that of the third light L3 exiting at the predetermined angle formed with the optical axis OA. Thus, although the second light L2 and the third light L3 are emitted at the same angle with respect to the optical axis OA, the path of the second light L2 is different from the path of the third light L3. Consequently, the brightness of the light provided to the display panel 110 may be prevented from being non-uniform due to the dark spot occurring in the upper portion of the first light emitting diode LD1 and the bright spot occurring in the upper portion of the second light emitting diode LD2b.

In FIG. 4C, the light paths of the second light L2 and the third light L3, which are emitted from the first point A1 of the first light emitting diode LD1 and the second point A2 of the second light emitting diode LD2b, respectively, at the predetermined angle with respect to the optical axis OA, are shown as viewed relative to the bottom portion 141.

Since the degree of diffusion of the second light L2 is different from that of the third light L3 due to the difference between the first lens distance SD1 and the second lens distance SD2 even through the second and third lights L2 and L3 are emitted at the same angle with respect to the optical axis OA, a point of the incident surface 230, through which the second light L2 passes, is different from a point of the incident surface 230, through which the third light L3 passes. For instance, an incident angle of the light with respect to a normal line of the first incident point P1a is different from an incident angle of the light with respect to a normal line of the second incident point P2a. In addition, a radius of curvature at the first incident point P1a is different from a radius of curvature at the second incident point P2a. As a result, a degree of refraction of the second light L2 is different from that of the third light L3.

In the present exemplary embodiment, the third light L3 exiting from the second point A2 is refracted at a larger angle than that of the second light L2 exiting from the first point A1 with respect to the optical axis OA. That is, even through the lights are exiting at the same angle with respect to the optical axis OA, the light passing through the lens having a relatively smaller lens distance may be more widely diffused than the light passing through the lens having a relatively larger lens distance.

Thus, the degree of diffusion of the second light L2 when the second light L2 travels by the first optical distance W1 may be substantially the same as or similar to the degree of diffusion of the third light L3 when the third light L3 travels by the third optical distance W3. Accordingly, a difference in brightness between the light reaching the area corresponding to the upper portion of the first light emitting diode LD1 of the diffusion member 150 and the light reaching the upper portion of the second light emitting diode LD2b of the diffusion member 150 is minimized. As a result, the backlight unit 120 (refer to FIG. 1) provides the light with uniform brightness to the display panel 110 (refer to FIG. 1), and thus the display quality of the display apparatus 100 (refer to FIG. 1) is improved.

Figure 5A:
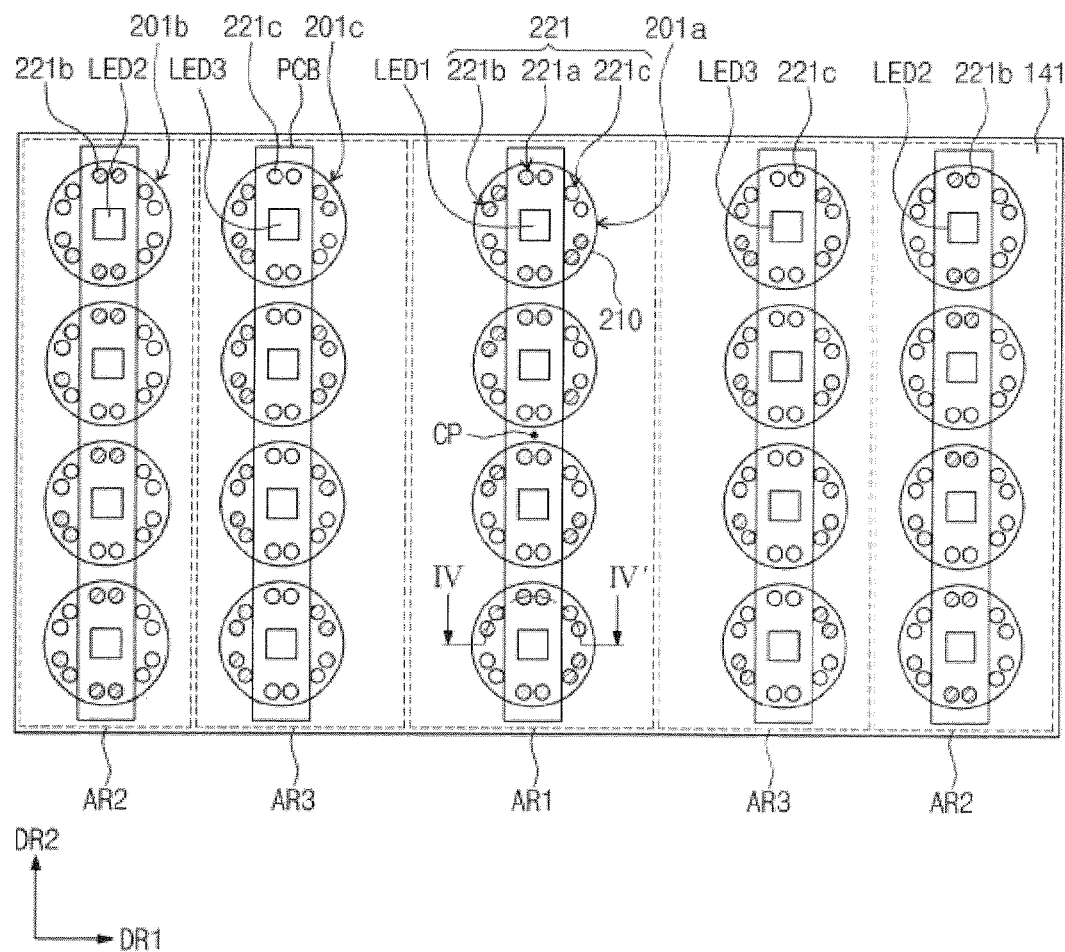
FIG. 5A is a plan view showing light emitting diodes disposed on a bottom portion of a bottom chassis according to another exemplary embodiment of the present disclosure.
Figure 5B:
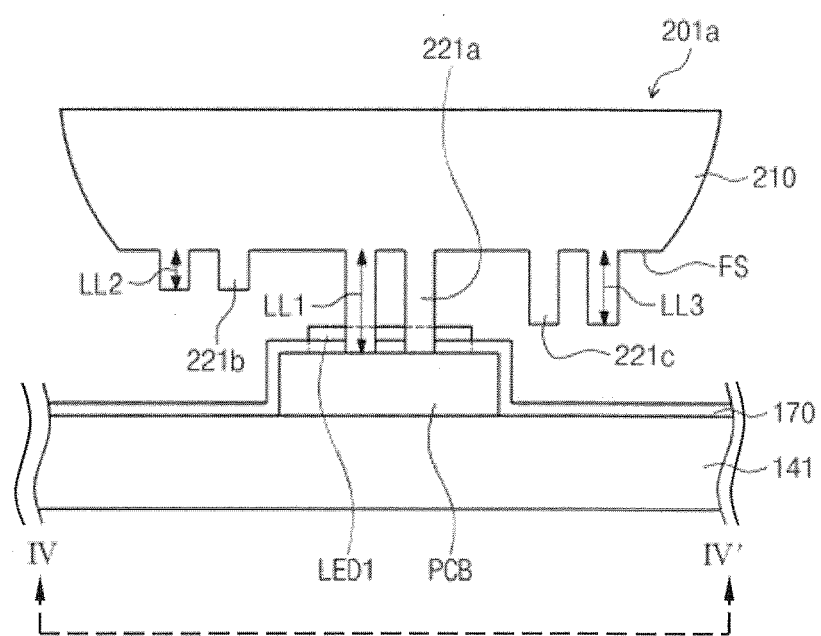
FIG. 5B is a cross-sectional view taken along a line IV-IV' of FIG. 5A.

FIG. 5A is a plan view showing light emitting diodes disposed on a bottom portion of a bottom chassis according to another exemplary embodiment of the present disclosure, and FIG. 5B is a cross-sectional view taken along a line IV-IV' of FIG. 5A.

Referring to FIGS. 5A and 5B, each of first, second, and third lens units 201a, 201b, and 201c includes a lens 210 and supporting parts 221. The supporting parts 221 are coupled to a bottom surface FS of the lens 210.

In the present exemplary embodiment, the supporting parts 221 include a first supporting part 221a, a second supporting part 221b, and a third supporting part 221c. The first, second, and third supporting parts 221a, 221b, and 221c may have different lengths from each other. The first supporting part 221a has a first length LL1, the second supporting part has a second length LL2, and the third supporting part 221c has a third length LL3. The third length LL3 is smaller than the first length LL1 and greater than the second length LL2.

A bottom portion includes a first area AR1, a second area AR2, and a third area AR3. When viewed in a plan view, the first area AR1 overlaps a center portion CP and extends in a second direction DR2, the third area AR3 is disposed adjacent to the first area AR1 and extends in the second direction dR2, and a remaining area corresponds to the second area AR2. That is, the third area AR3 is disposed between the first area AR1 and the second area AR2. A first light emitting diode LED1 is disposed in the first area AR1, a second light emitting diode LED2 is disposed in the second area AR2, and a third light emitting diode LED3 is disposed in the third area AR3.

The first lens unit 201a is disposed on the first light emitting diode LED1, the second lens unit 201b is disposed on the second light emitting diode LED2, and the third lens unit 201c is disposed on the third light emitting diode LED3. The first lens unit 201a is supported by the first supporting part 221a on a printed circuit board PCB, the second lens unit 201b is supported by the second supporting part 221b on the printed circuit board PCB, and the third lens unit 201c is supported by the third supporting part 221c on the printed circuit board PCB.

In the present exemplary embodiment, since the supporting parts 221 include the first, second, and third supporting parts 221a, 221b, and 221c respectively having the first, second, and third lengths LL1, LL2, and LL3, the lens distance may be adjusted to have various values. Accordingly, the brightness of the light emitted from the backlight unit 120 (refer to FIG. 1) may be easily controlled to be uniform.

In the present exemplary embodiment, each of the first, second, and third supporting parts 221a, 221b, and 221c includes four supporting areas, but it should not be limited thereto or thereby. According to another embodiment, each of the first, second, and third supporting parts 221a, 221b, and 221c may include two supporting areas as shown in FIG. 3.

Figure 6:
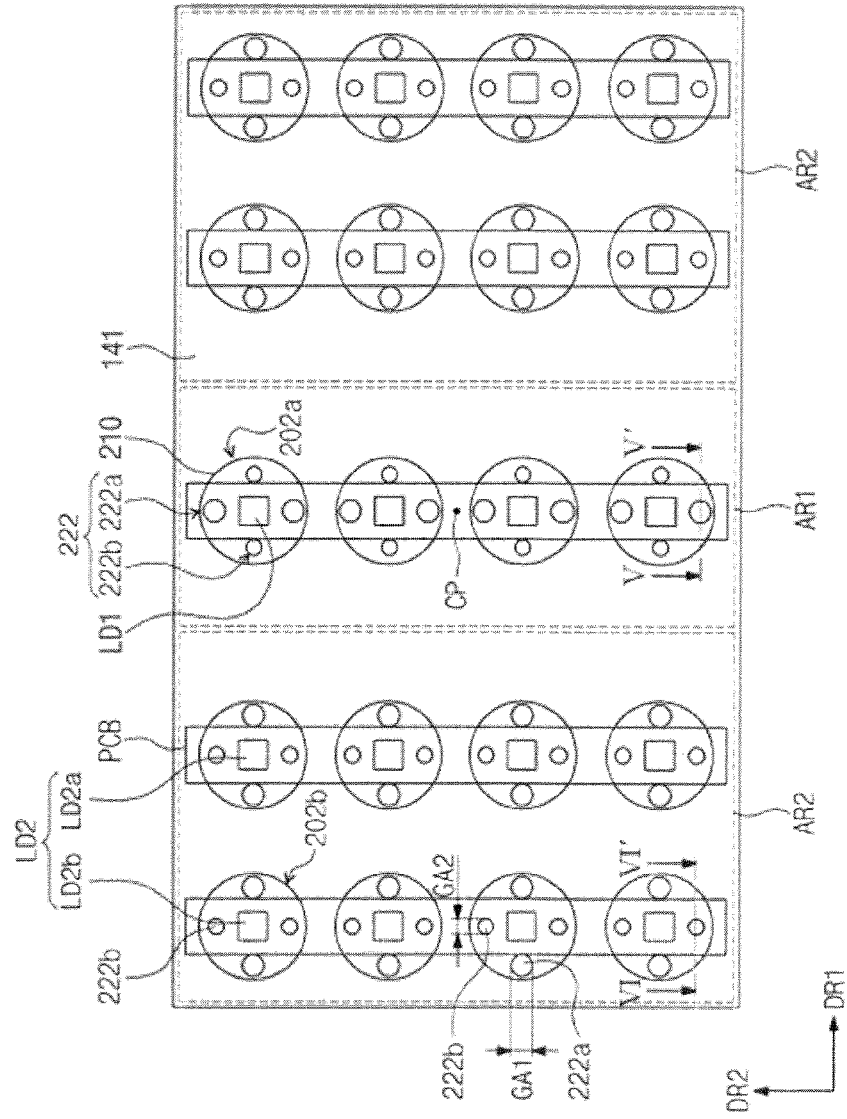
FIG. 6 is a plan view showing light emitting diodes disposed on a bottom portion of a bottom chassis according to another exemplary embodiment of the present disclosure.
Figure 7A:
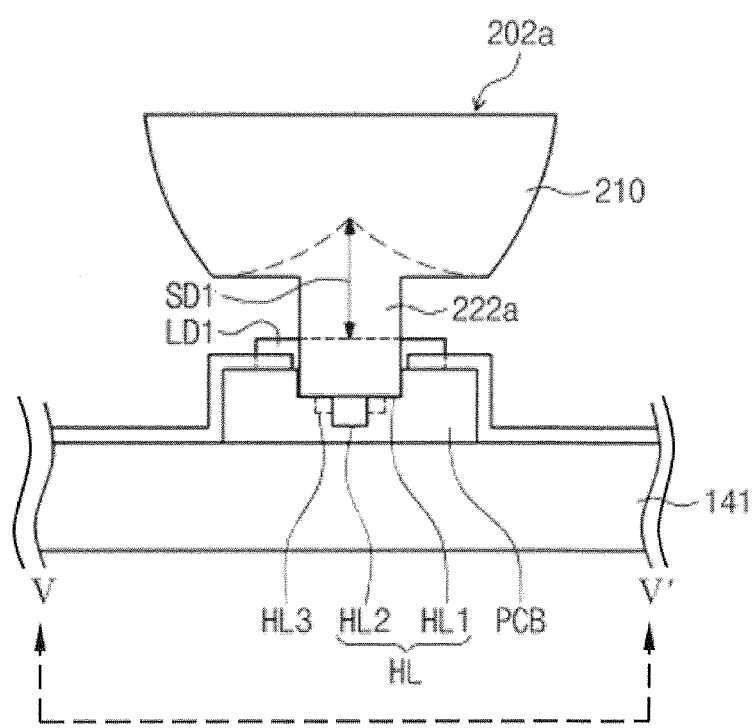
FIG. 7A is a cross-sectional view taken along a line V-V' of FIG. 6.
Figure 7B:
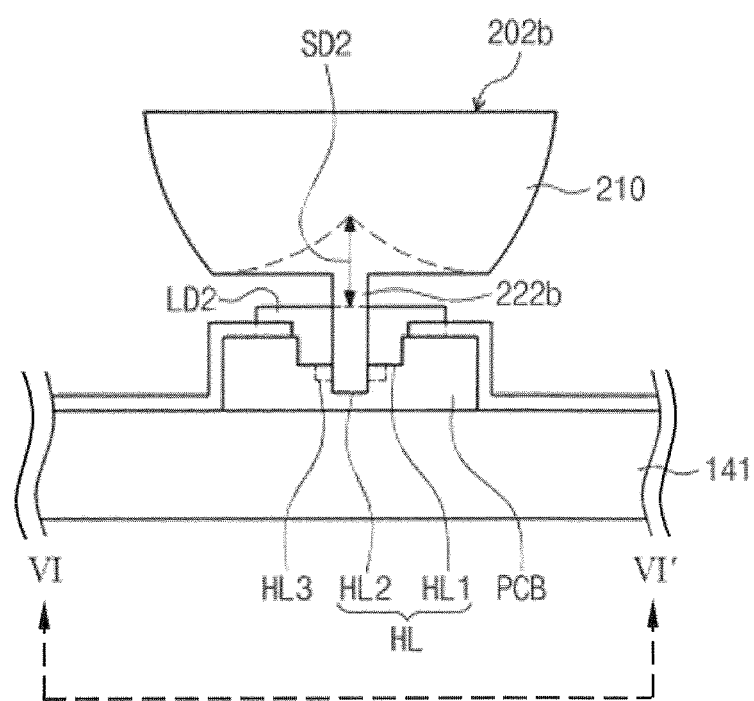
FIG. 7B is a cross-sectional view taken along a line VI-VI' of FIG. 6.

FIG. 6 is a plan view showing light emitting diodes disposed on a bottom portion of a bottom chassis according to another exemplary embodiment of the present disclosure, FIG. 7A is a cross-sectional view taken along a line V-V' of FIG. 6, and FIG. 7B is a cross-sectional view taken along a line VI-VI' of FIG. 6. In FIGS. 6, 7A, and 7B, the same reference numerals denote the same elements in FIG. 3, and thus detailed descriptions of the same elements will be omitted.

Referring to FIGS. 6, 7A, and 7B, each of the first and second lens units 202a and 202b includes a lens 210 and supporting parts 222. The supporting parts 222 include a first supporting part 222a and a second supporting part 222b. The first supporting part 222a may have substantially the same length as that of the second supporting part 222b, but the first supporting part 222a has a first sectional area GA1 different from a second sectional area GA2 of the second supporting part 222b. In the present exemplary embodiment, the second sectional area GA2 is smaller than the first sectional area GA1. The first lens unit 202a is disposed on a first light emitting diode LD1 disposed in a first area AR1, and the second lens unit 202b is disposed on a second light emitting diode LD2 disposed in a second area AR2.

As shown in FIGS. 7A and 7B, a printed circuit board PCB has holes HL formed therethrough. The supporting parts 222 are accommodated in the holes HL. Each of the holes HL includes a first hole HL1 corresponding to the first sectional area GA1, in which the first supporting part 222a is accommodated and a second hole HL2 corresponding to the second sectional area GA2, in which the second supporting part 222b is accommodated. The second hole HL2 is connected to the first hole HL1 and disposed at a lower portion of the first hole HL.

The lens 210, which covers the first light emitting diode LD1 disposed in the first area AR1, is supported by the first supporting part 222a on the printed circuit board PCB. Referring to FIG. 7A, the first supporting part 222a is accommodated only in the first hole HL1 of the first and second holes HL1 and HL2.

A stepped portion is formed between the first and second holes HL1 and HL2 due to a difference in size between the first hole HL1 and the second hole HL2, and the first supporting part 222a is supported by the stepped portion between the first and second holes HL1 and HL2.

The lens 210, which covers the second light emitting diode LD2 disposed in the second area AR2, is supported by the second supporting part 222b on the printed circuit board PCB. Referring to FIG. 7B, the second supporting part 222b is accommodated in the first hole HL1 and the second hole HL2.

Accordingly, a first lens distance SD1 between the first light emitting diode LD1 and the first lens unit 202a is greater than a second lens distance SD2 between the second light emitting diode LD2 and the second lens unit 202b. Therefore, defects, such as a dark spot or a bright spot, which occur in the upper portion of the backlight unit 120 (refer to FIG. 1) due to the difference in optical distance, may be minimized. As a result, the backlight unit 120 (refer to FIG. 1) may provide the light with uniform brightness to the display panel 110 (refer to FIG. 1), and the display quality of the display apparatus 100 (refer to FIG. 1) may be improved.

In the present exemplary embodiment, the supporting parts 222 include the first supporting part 222a and the second supporting part 222b, however, according to embodiments, the supporting parts 222 may further include a third supporting part (not shown). A third sectional area of the third supporting part may be smaller than the first sectional area GA1 and greater than the second sectional area GA2. Accordingly, the printed circuit board PCB may further include a third hole HL3 corresponding to the third sectional area. The third hole HL3 is defined between the first hole HL1 and the second hole HL2. For the sake of clarity and ease of understanding, the third hole HL3 is shown in a dotted line in FIGS. 7A and 7B. In this case, the lens 210 disposed on a second light emitting diode LD2a shown in FIG. 6 is supported by third supporting parts (not shown) and the lens 210 disposed on a second light emitting diode LD2b shown in FIG. 6 is supported by the second supporting part 222b. When various supporting parts are employed as in the present exemplary embodiment, the lens distances are controlled to have various values, and thus the brightness of the light emitted from the backlight unit 120 (refer to FIG. 1) may be easily controlled to be uniform.

Figure 8:
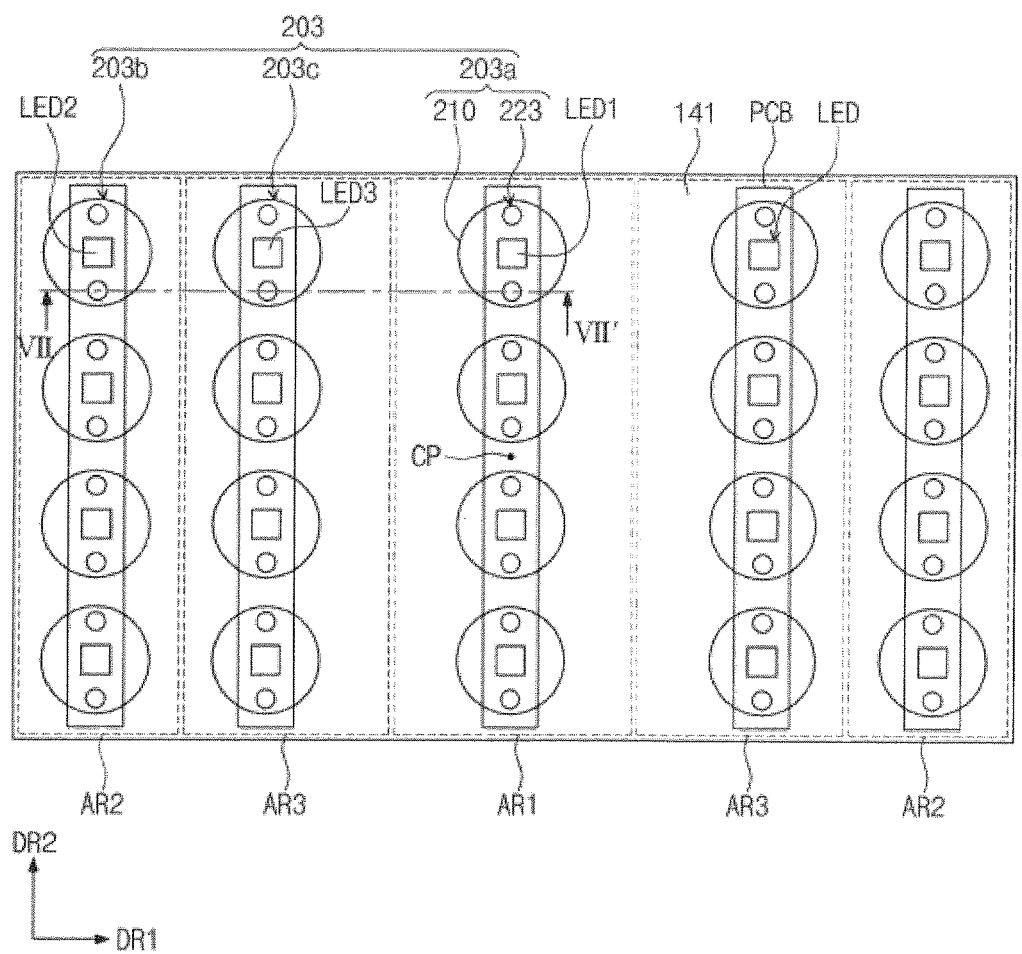
FIG. 8 is a plan view showing light emitting diodes disposed on a bottom portion of a bottom chassis according to another exemplary embodiment of the present disclosure.
Figure 9:
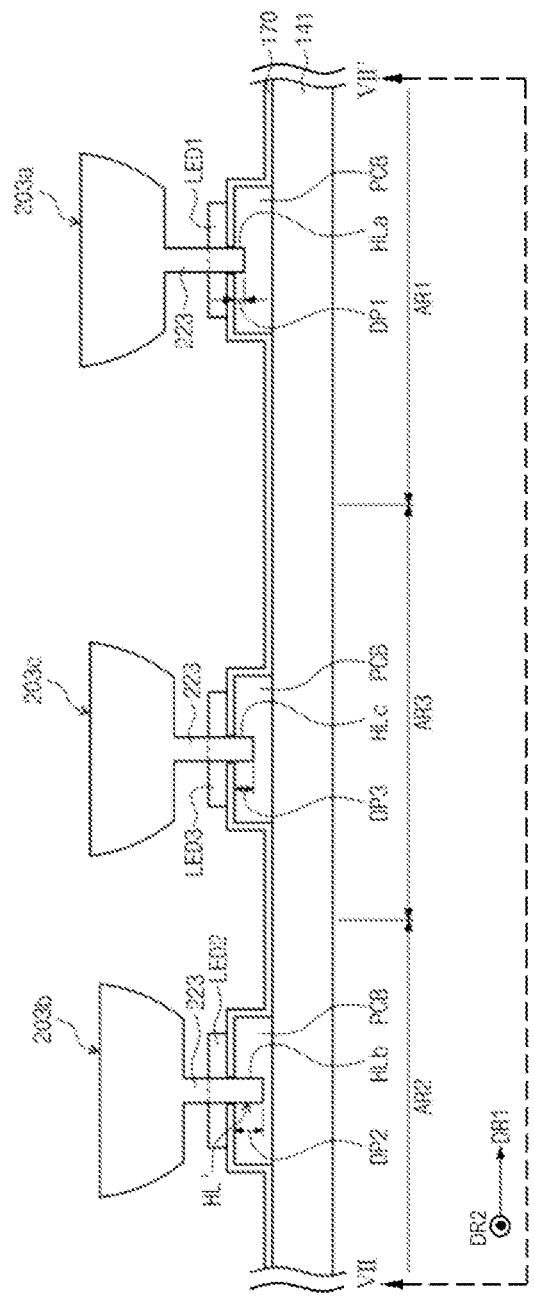
FIG. 9 is a cross-sectional view taken along a line VII-VII' of FIG. 8.

FIG. 8 is a plan view showing light emitting diodes disposed on a bottom portion of a bottom chassis according to another exemplary embodiment of the present disclosure, and FIG. 9 is a cross-sectional view taken along a line VII-VII' of FIG. 8. In FIGS. 8 and 9, the same reference numerals denote the same elements in FIG. 5A, and thus detailed descriptions of the same elements will be omitted.

Referring to FIGS. 8 and 9, light emitting diodes LED are arranged substantially in parallel to each other along a first direction DR1 and a second direction DR2. The light emitting diodes LED are disposed on a printed circuit board PCB, and the printed circuit board PCB is provided with holes HL' formed therethrough, into which supporting parts 223 of each of lens units 203 are inserted.

The holes HL' are defined around the light emitting diodes LED. The light emitting diodes LED include a first light emitting diode LED1 disposed in a first area AR1, a second light emitting diode LED2 disposed in a second area AR2, and a third light emitting diode LED3 disposed in a third area AR3.

A first hole HLa having a first depth DP1 is defined around the first light emitting diode LED1, a second hole HLb having a second depth DP2 is defined around the second light emitting diode LED2, and a third hole HLc having a third depth DP3 is defined around the third light emitting diode LED3. In the present exemplary embodiment, the first depth DP1 is smaller than the third depth DP3 and the third depth DP3 is smaller than the second depth DP2. That is, the depth of the holes HL' becomes greater as a distance from the first area AR1 increases in the first direction DR1. Among the holes HL', the holes HL' arranged in the same column along the second direction DR2 have the same depth.

Since the lens distances are different from each other according to the positions of the light emitting diodes LED, defects, such as a dark spot or a bright spot, which occur in the upper portion of the backlight unit 120 (refer to FIG. 1) due to the difference in optical distances, may be minimized. Thus, the backlight unit 120 (refer to FIG. 1) may provide the light with uniform brightness to the display panel 110 (refer to FIG. 1) and the display quality of the display apparatus 100 (refer to FIG. 1) is improved. In addition, the lens distances are controlled to have various values by adjusting the depth of the holes HL', and thus the brightness of the light emitted from the backlight unit 120 (refer to FIG. 1) may be easily controlled to be uniform.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed.

What is claimed is:
1. A display apparatus comprising:
a display panel curved along a first direction; and
a backlight unit providing a light to the display panel, the backlight unit comprising:
a bottom chassis curved along the first direction and including a bottom portion configured to include a first area and a second area, which are arranged in the first direction;
a plurality of light emitting diodes disposed on the bottom portion; and a plurality of lens units covering the light emitting diodes in a one-to-one correspondence, the light emitting diodes comprising:

at least one first light emitting diode disposed in the first area; and at least one second light emitting diode disposed in the second area, a first lens distance between the first light emitting diode and a first lens unit covering the first light emitting diode among the lens units is different from a second lens distance between the second light emitting diode and a second lens unit covering the second light emitting diode among the lens units.

2. The display apparatus of claim 1, further comprising a diffusion member disposed on the lens units and curved along the first direction, a first optical distance between the first light emitting diode and the diffusion member is different from a second optical distance between the second light emitting diode and the diffusion member.

3. The display apparatus of claim 2, the bottom portion has a radius of curvature different from a radius of curvature of the diffusion member.

4. The display apparatus of claim 1, the first area overlaps a center portion of the bottom portion when viewed in a plan view and extends in a second direction substantially perpendicular to the first direction, and the second area corresponds to a remaining area of the bottom portion except for the first area.

5. The display apparatus of claim 4, the light emitting diodes further comprises:

a third light emitting diode disposed in the first area and spaced apart from the first light emitting diode in the second direction; and a fourth light emitting diode disposed in the second area and spaced apart from the second light emitting diode in the second direction, a distance between the third light emitting diode and a third lens unit covering the third light emitting diode among the lens units is substantially same as the first lens distance, and a distance between the fourth light emitting diode and a fourth lens unit covering the fourth light emitting diode among the lens units is substantially same as the second lens distance.

6. The display apparatus of claim 4, the second lens distance is smaller than the first lens distance.

7. The display apparatus of claim 4, further comprising a printed circuit board disposed between the bottom portion and the light emitting diodes and configured to mount the light emitting diodes, each of the lens units comprises:

a lens covering a corresponding light emitting diode among the light emitting diodes; and supporting parts coupled to a bottom surface of the lens.

8. The display apparatus of claim 7, the supporting parts comprise:

at least one first supporting part having a first length; and at least one second supporting part spaced apart from the first supporting part and having a second length smaller than the first length.

9. The display apparatus of claim 8, the first lens unit is supported by the first supporting part on the printed circuit board, and the second lens unit is supported by the second supporting part on the printed circuit board.

10. The display apparatus of claim 8, the supporting parts further comprise a third supporting part having a third length, and the third length is smaller than the first length and greater than the second length.

11. The display apparatus of claim 10, the light emitting diodes further comprise a third light emitting diode disposed in a third area defined between the first area and the second area, the lens units further comprise a third lens unit covering the third light emitting diode, and the third lens unit is supported by the third supporting part on the printed circuit board.

12. The display apparatus of claim 7, the supporting parts comprise:

at least one first supporting part having a first sectional area; and at least one second supporting part spaced apart from the first supporting part and having a second sectional area smaller than the first sectional area, holes, into which the supporting parts are inserted, are defined through the printed circuit board, and the holes comprise a first hole having a size corresponding to the first sectional area and a second hole having a size corresponding to the second sectional area and being disposed at a lower portion of the first hole.

13. The display apparatus of claim 12, the first lens unit is supported by the first supporting part which is accommodated only in the first hole on the printed circuit board and the second lens unit is supported by the second supporting part which is accommodated in the first and second holes on the printed circuit board.

14. The display apparatus of claim 7, holes, into which the supporting parts are inserted, are defined through the printed circuit board, the holes are configured to include a first hole and a second hole, and a first depth of the first hole, into which the supporting parts of the first lens units are inserted, among the holes is different from a second depth of the second hole, into which the supporting parts of the second lens units are inserted, among the holes.

15. The display apparatus of claim 14, the first depth is smaller than the second depth.

16. The display apparatus of claim 14, the second depth of the holes becomes greater as a distance from the first area to the holes increases in the first direction.

17. The display apparatus of claim 14, the holes are arranged in the first direction and the second direction, and the holes arranged in the same column along the second direction among the holes have a same depth.

18. A backlight assembly comprising:

a bottom chassis curved along a first direction and including a bottom portion in which a first area and a second area are defined;

a plurality of light emitting diodes disposed on the bottom portion; and a plurality of lens units covering the light emitting diodes in a one-to-one correspondence, the light emitting diodes comprising:

at least one first light emitting diode disposed in the first area; and at least one second light emitting diode disposed in the second area, a first lens distance between the first light emitting diode and a first lens unit covering the first light emitting diode among the lens units is different from a second lens distance between the second light emitting diode and a second lens unit covering the second light emitting diode among the lens units.

19. The backlight assembly of claim 18, further comprising a diffusion member disposed on the lens units and curved along the first direction, the bottom portion has a radius of curvature different from a radius of curvature of the diffusion member.

20. The backlight assembly of claim 18, the first area extends in a second direction substantially perpendicular to the first direction from a center portion of the bottom portion, and the second area corresponds to a remaining area of the bottom portion except for the first area.

* * * * *